(12) United States Patent
Hoover

(10) Patent No.: US 6,860,713 B2
(45) Date of Patent: Mar. 1, 2005

(54) FAN WITH COLLAPSIBLE BLADES, REDUNDANT FAN SYSTEM, AND RELATED METHOD

(75) Inventor: John Hoover, Barkhamsted, CT (US)

(73) Assignee: Nidec Corporation, Torrington, CT (US)

( * ) Notice: Subject to any disclaimer, the term of this patent is extended or adjusted under 35 U.S.C. 154(b) by 58 days.

(21) Appl. No.: 10/305,628

(22) Filed: Nov. 27, 2002

(65) Prior Publication Data

US 2004/0101406 A1 May 27, 2004

(51) Int. Cl.$^7$ ................................................. F01D 5/00
(52) U.S. Cl. ........................ 415/66; 416/143; 416/142
(58) Field of Search ........................... 416/87, 88, 131, 416/132 R, 140, 142, 143, 125; 415/66, 68, 67

(56) References Cited

U.S. PATENT DOCUMENTS

| | | |
|---|---|---|
| 725,097 A | 4/1903 | Learnard |
| 1,445,402 A * | 2/1923 | Le Velle .................... 416/87 |
| 1,728,768 A | 9/1929 | O'Connor |
| 1,835,284 A | 12/1931 | Crowhurst |
| 2,374,822 A | 5/1945 | Rippingille |
| 3,565,544 A | 2/1971 | Marshall |
| 4,095,919 A | 6/1978 | Ehrenskjold et al. |
| 4,364,711 A | 12/1982 | Brandt et al. |
| 4,776,761 A | 10/1988 | Diaz |
| 4,801,243 A | 1/1989 | Norton |
| 4,979,876 A | 12/1990 | Chapman |
| 5,183,384 A | 2/1993 | Trumbly |
| 5,546,272 A * | 8/1996 | Moss et al. ............... 361/687 |
| 6,213,716 B1 | 4/2001 | Bucher et al. |
| 6,253,834 B1 * | 7/2001 | Sterner .................... 165/80.3 |
| 6,371,726 B1 | 4/2002 | Jonsson et al. |

* cited by examiner

Primary Examiner—Edward K. Look
Assistant Examiner—Dwayne J. White
(74) Attorney, Agent, or Firm—McCarter & English, LLP

(57) ABSTRACT

A redundant fan system for a computer includes two fans installed in series with at least one of the fans having collapsible blades. A fan system of this type reduces the fan inefficiency caused when one fan in a series mounted pair is not operating, either because it is free-wheeling or in a locked rotor condition. When non-operational, the fan blades of the collapsible fan fold inward due to airflow generated by the operational fan over the collapsible blades. The ability of the blades to fold reduces the inefficiency of the operational fan, having less of an effect on fan life. Also, because the flow of air is less restricted, proper airflow can be maintained, thus preventing overheating of the computer.

35 Claims, 9 Drawing Sheets

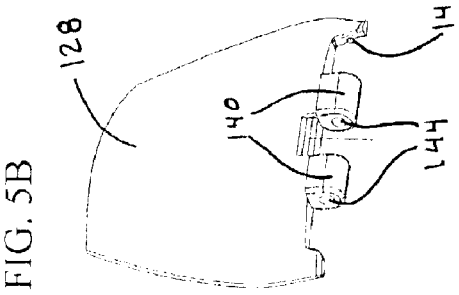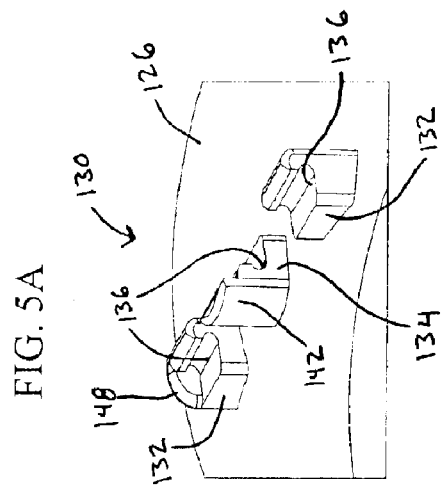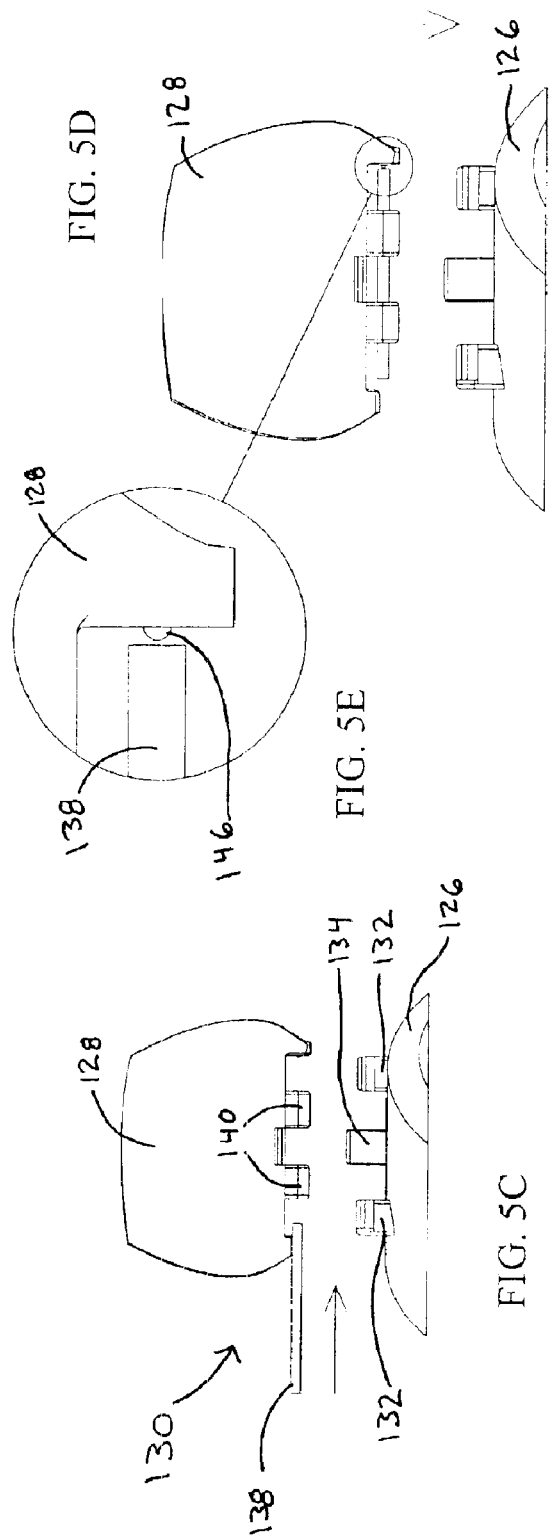

FAN WITH COLLAPSIBLE BLADES, REDUNDANT FAN SYSTEM, AND RELATED METHOD

FIELD OF THE INVENTION

The present disclosure relates to fans having collapsible blades and redundant airflow systems that employ fans with collapsible blades. The present disclosure further relates to systems that can provide redundant airflow in a variety of applications, including computers, electronic communications, appliances and automotive applications, while reducing the problem of fan inefficiencies that are present when a non-operational fan is in an inoperative locked rotor or free-wheeling condition.

BACKGROUND INFORMATION

Fans are critical components of computers, providing cooling airflow to processors, microchips, and other components. When fans fail, internal temperatures rise, which at the least necessitates shutting down the computer and replacing the failed fan. At the worst, the fan failure goes unnoticed by support personnel, causing improper performance or even permanent damage to the computer. In either case, productivity decreases and cost increases. In addition, in some computing applications, such as computer servers, the computers must be run continuously, regardless of whether there is a fan failure.

A solution to this problem would be to install multiple fans to serve the computer. In this age of smaller and smaller computers, however, space is at a premium, and every fan added means larger computers, higher costs, and less space for other components. Fans installed in a parallel configuration take up significantly more room than a single fan alone, and the installation of the second fan may not be in a location that allows for optimal airflow over the computer components.

Fans installed in series suffer from different problems. If one fan is not functioning, the other fan would be operating less efficiently, trying to move air past the non-operational fan. If the non-operational fan is in a free-wheeling condition (i.e., spinning due to airflow over the blades), efficiency of the operational fan is still reduced. A locked-rotor condition in the non-operational fan poses an even greater obstacle to proper airflow. These conditions also may lead to reduced fan life for the operational fan. The solution to this problem would be to remove the non-operational fan from the path of the airflow, but this solution is not practical.

Another drawback associated with current tube axial fans is that the number of blades that can be formed on a given fan is limited by the construction of, and processes used to manufacture such fans. Typically, the greater the number of blades that can be formed on a tube axial fan of given size and geometry, the greater will be the flow rate of the fan at each pressure point (i.e., the pressure differential between the inlet and outlet of the fan during operation). Accordingly, in order to increase the flow rate of a tube axial fan of given size and geometry, it is desirable to maximize the number of blades on the fan. In certain applications, this may involve forming the blades in an overlapping manner (i.e., wherein the trailing edge of each blade angularly overlaps the leading edge of the adjacent blade). In many commercially available tube axial fans, the blades and rotor hub are formed of plastic and injection molded as a single part. Typically, the molding equipment requires that the adjacent edges of the blades be angularly spaced relative to each other (i.e., the trailing edge of each blade must be angularly spaced from the leading edge of the next blade). Otherwise, the manufacturing process would require overly complex and/or expensive molding equipment that would render the fan commercially impractical. Accordingly, it has been considered impractical to injection mold rotor hub and blade assemblies with overlapping blades. One manufacturer has provided a tube axial fan with overlapping blades by welding the blades to the rotor hub. However, this manufacturing process is believed to be relatively expensive and therefore undesirable in comparison to the processes used to injection mold conventional tube axial rotor hub and blade assemblies.

What is needed then, is a collapsible fan and fan system that provide redundant airflow to a computer or other electronic applications (e.g., communication, appliance and automotive applications) without taking up much more space than a single fan. Also, to reduce fan inefficiencies that occur when an operational fan attempts to move air past a non-operational fan, a collapsible fan and redundant fan system that minimize blockage by the non-operational fan would be desired. Collapsible fans already exist in applications other than computers or electronic applications wherein the fans fold during periods of non-operation, using a mechanical means (e.g., a spring), the dynamic pressure of the passive flow of fluid over the blades, or gravity. Some of these fans are forced open due to centrifugal motion when operating. None of these fans, however, address the problem of reduced fan efficiency in series mounted fans in the event of a fan failure. Similarly, none of the existing collapsible fans address the problem of continuously operating a computer or other electronic apparatus (e.g., communications equipment, appliances, and automotive equipment) in the event of a fan failure.

Accordingly, it is an object of the present invention to overcome one or more the above-described drawbacks and disadvantages of the prior art.

SUMMARY OF THE INVENTION

One aspect of the present invention is directed to a fan having collapsible fan blades and a system and method employing the collapsible fan for providing redundant airflow in a manner that reduces the fan inefficiency caused when one fan in a series mounted pair is not operating, either because it is free-wheeling or in a locked rotor condition. The first or collapsible fan includes collapsible blades that open due to centrifugal motion when the fan is operating. If and when the first fan ceases to operate, either because of mechanical or electrical failure or otherwise, the second fan can be energized. Energizing the second fan creates an airflow that forces the collapsible blades of the first fan to fold inward and prevent undesirable blockage of the air stream by the blades of the non-operational fan. In accordance with another aspect of the present invention, the collapsible blades angularly overlap one another such that the leading edge of one blade angularly overlaps the trailing edge of an adjacent blade.

One advantage of the currently preferred embodiments of the present invention is that they provide a collapsible fan and redundant fan system and method for computer systems and other electronic applications, thereby eliminating cost and downtime in the event of a fan failure. Another advantage is that the collapsible fan and redundant fan system can be installed in less space than would be possible if two fans were installed in parallel. Still another advantage is that efficiency of the operating fan will be less affected if the blades of the non-operational fan are effectively removed from the air stream, thus maintaining cooling efficiency and reducing additional wear on the operational fan. Yet another advantage of a preferred embodiment of the present invention is that the blades may angularly overlap one another, thereby enabling more blades to be mounted on the hub in comparison to prior art tube axial fans of the same size, and thus enabling increased flow rates at given pressure points in comparison to such prior art fans.

These and other features and advantages of the present invention are more fully disclosed or rendered apparent from the following detailed description of certain preferred embodiments of the invention, that are to be considered together with the accompanying drawings.

BRIEF DESCRIPTION OF THE DRAWINGS

FIG. 5A is a partial, perspective view of one of the fans of FIGS. 2 and 3 illustrating the pivot mounts formed on the fan rotor of another embodiment of a pivot connector;

FIG. 5B is a perspective view of a collapsible fan blade of one of the fans of FIGS. 2 and 3 illustrating in further detail the base portion of the fan blade;

FIG. 5C is a partial, side elevational, exploded view of the fan of FIG. 5A illustrating the assembly of a pivot pin to a collapsible blade;

FIG. 5D is another partial, side elevational, exploded view of the fan of FIG. 5A illustrating the assembly of the pivot pin and collapsible blade to the rotor;

FIG. 5E is an enlarged, elevational view of a portion of the collapsible fan blade of FIG. 5D showing the pin seated against the stop surface of the blade;

DETAILED DESCRIPTION OF THE PREFERRED EMBODIMENTS

Figure 1:
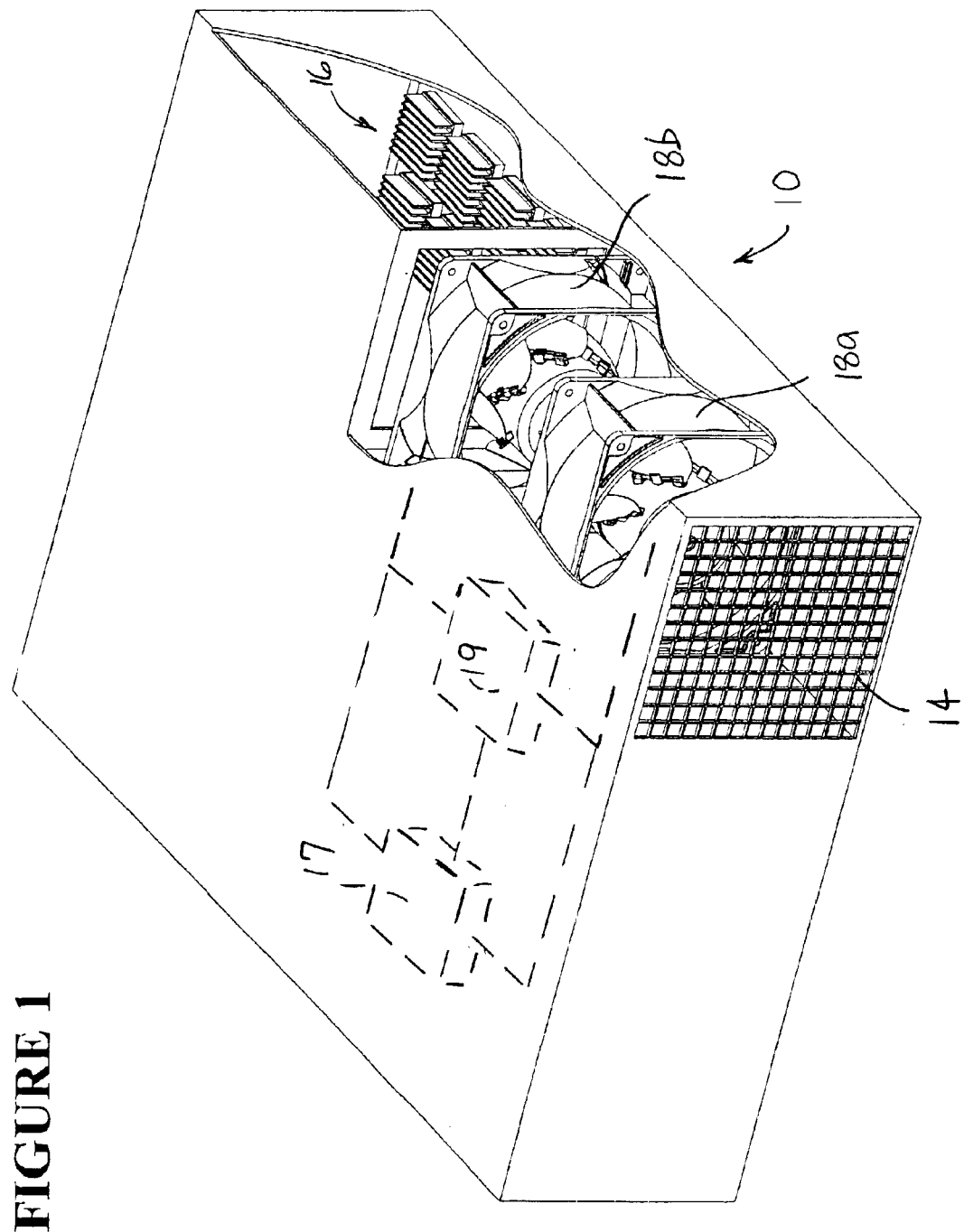
FIG. 1 is a partial cut-away, perspective view of a computer employing a collapsible fan and redundant fan system of the present invention.

The currently preferred embodiments of the present invention overcome many of the problems that arise when fan systems that are used in computers and other electronic applications fail. The advantages, and other features of the disclosed fan, system and method, will become more readily apparent to those having ordinary skill in the pertinent art from the following detailed description of certain preferred embodiments taken in conjunction with the drawings which set forth representative embodiments of the present invention and wherein like reference numerals identify similar structural elements.

In FIG. 1, numeral 10 generally refers to a computer having a computer housing 12 served by a redundant fan system. The computer housing 12 defines at least one opening 14 and contains a number of computer components 16 (e.g., transformers, processors, circuitry, integrated circuits, power supplies, or like elements). A redundant fan system of the present invention includes a first fan 18a and a second fan 18b. As can be seen, the second fan 18b is axially aligned with the first fan 18a such that the two fans are mounted in series. In this embodiment, both the first fan 18a and the second fan 18b of the redundant fan system have collapsible blades. However, as described further below, only one of the fans may have collapsible blades if so desired.

The opening 14 of the computer housing 12 may be covered with a mesh, screen, or other means for preventing entry of foreign objects in through the opening 14. For clarity, the computer components 16 are shown in FIG. 1 as being installed in line with the fans 18a–18b. One of ordinary skill in the pertinent art will recognize that FIG. 1 is a simplified configuration of a computer. The redundant fan system of the present invention could also be installed in computers that have more than a single opening, and the exact location of computer components is not critical to the disclosure of the present invention. It is desirable, though, that the fan system be located so as to allow the most airflow possible over the various components and otherwise to most efficiently cool the components.

Still referring to FIG. 1, the first fan 18a and the second fan 18b are installed axially along the center of each fan's rotor. A person of ordinary skill in the pertinent art will recognize that the exact location and spacing between the first fan 18a and the second fan 18b can vary depending on space restraints or other considerations. For example, the fans 18a–18b may be installed with housings in contact or may be separated by a predetermined distance. In the illustrated embodiment, spacing between the first fan 18a and the second fan 18b may be set such that substantially laminar airflow is achieved before the air stream contacts the non-operational fan. This would lessen the possibility of the collapsible blades of the non-operational fan moving or chattering if very turbulent air were to contact the collapsed blades. A person of ordinary skill in the pertinent art will also recognize that the first fan 18a and the second fan 18b can be installed to move air either into or out of the computer housing.

In the embodiment of FIG. 1, both the first fan 18a and second fan 18b are shown as having collapsible blades. A person of ordinary skill in the pertinent art will readily appreciate that the first fan 18a could have fixed blades and the second fan 18b could have collapsible blades, or vice versa. This type of system, where one fan has collapsible blades and the other has fixed blades, may reduce total cost in comparison to a system where both fans have collapsible blades.

FIG. 1 shows a redundant fan system installed in a computer housing 12, but the fan, system and method of the present invention are not limited to applications related only to computers. The fan, system and method of the present invention would be equally useful in applications where fan redundancy is required or desired. For example, the fan, system and method of the present invention could be used in communications equipment, appliances, automotive equipment, building ventilation systems, fume exhaust systems, or in other air moving systems. In addition, the fan, system and method of present invention could be employed in any series mounted fan application where minimal effect on the operational fan is desired.

A person of ordinary skill in the pertinent art also will recognize that, in computer applications, both fans may be installed not just within the enclosure itself. Rather, one or both fans may be mounted to the outside of the enclosure on a frame or similar supporting device. In a larger computer, for example, mounting a collapsible blade fan on the exterior of a housing that contains only a single fan would create an after-market redundant fan system. Mounting at least one fan exterior to the housing also can simplify or otherwise facilitate the ability to repair or replace the fan. In that example, if the primary fan were installed on the exterior of the enclosure and were to fail, the secondary fan would be energized, collapsing the blades of the primary fan. Once support personnel notice the failed primary fan, they could easily remove the primary fan, even while the secondary fan is operating, and replace it. Once replaced, the secondary fan could be de-energized and the new primary fan energized, collapsing the blades of the secondary fan.

Various types of control systems are contemplated for the redundant fan system of the present invention. As shown in broken lines in FIG. 1, the redundant fan system includes a controller 17 electronically coupled to the first and second fans 18*a* and 18*b*, respectively. As may be recognized by those of ordinary skill in the pertinent art based on the teachings herein, virtually any type of controller presently available or developed in the future may be used to control the two fans. Also, the control system preferably includes a sensor 19 for sensing a failure of an operational fan that is electronically coupled to the controller 17 and to each fan having collapsible blades. The sensor 19 may take the form of any of numerous structures that are currently or later become known for performing the function of sensing a failure of an operational fan, including devices that measure or sense airflow, pressure changes, temperature changes within the computer housing, electrical current flows, or other conditions that would indicate that a fan has failed, such as a vane switch, a locked rotor signal, a pressure sensor or a temperature gauge.

Figure 2A:
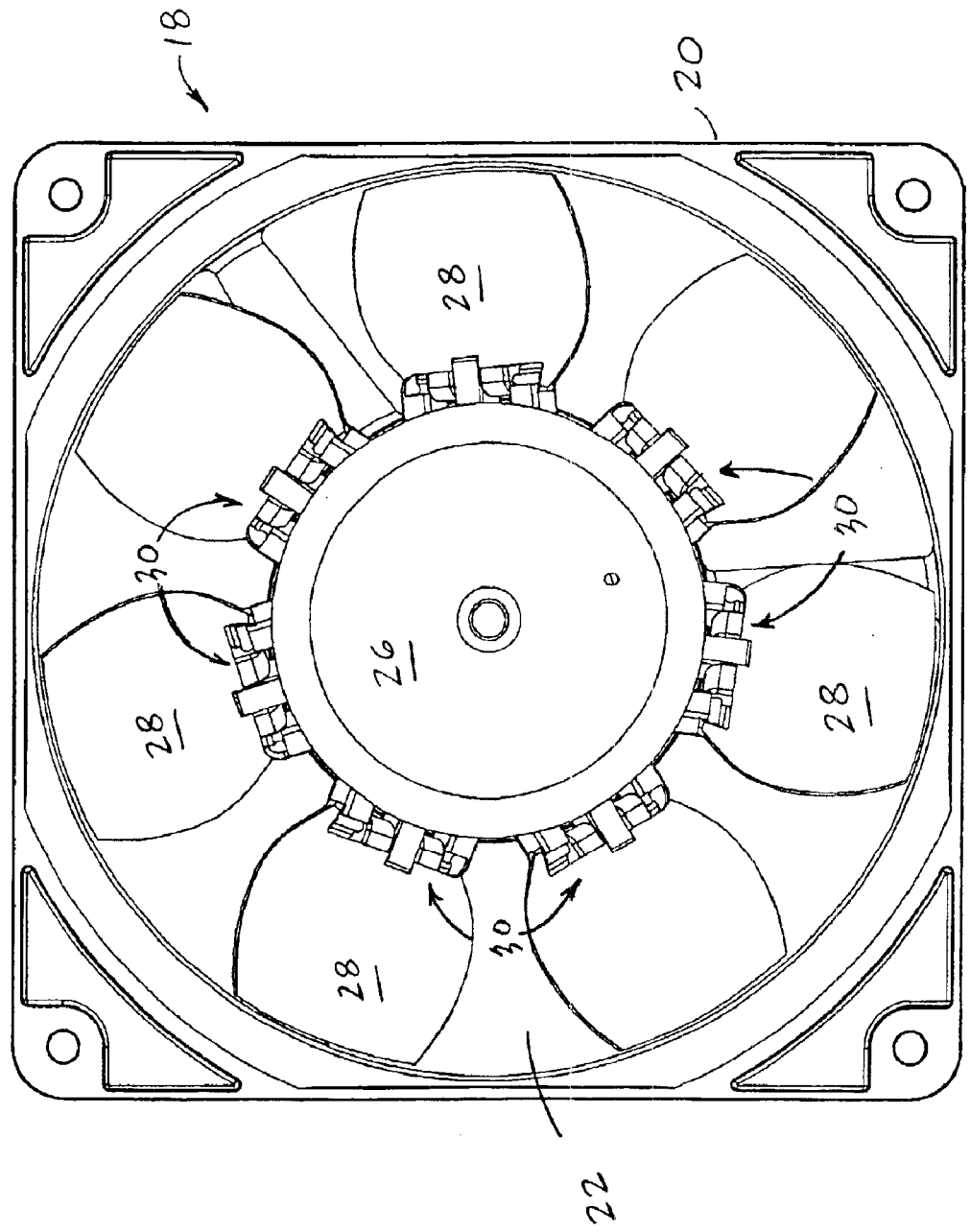
FIG. 2A is a front view of the fan with collapsible blades of FIG. 1 in the open position.
Figure 2B:
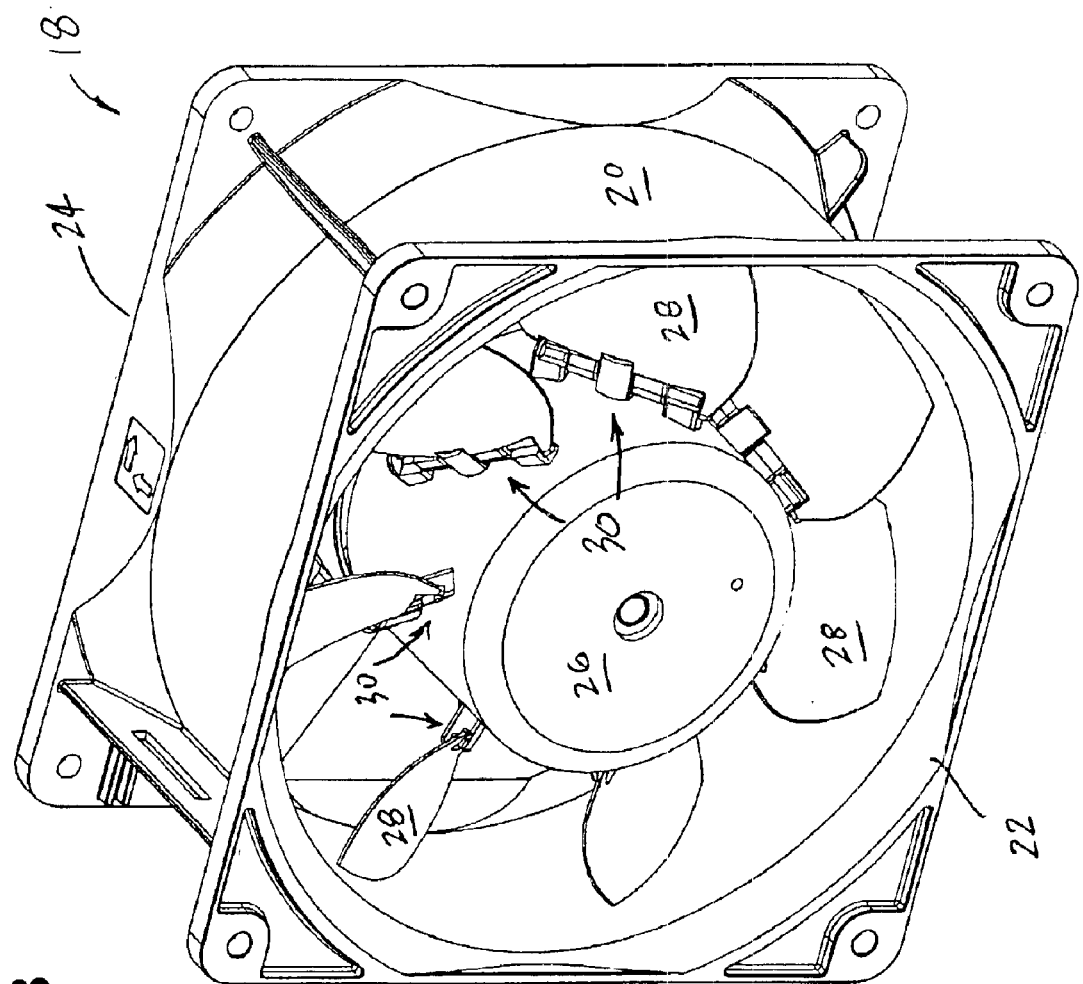
FIG. 2B is a perspective view of the fan with collapsible blades of FIG. 1 in the open position.
Figure 3A:
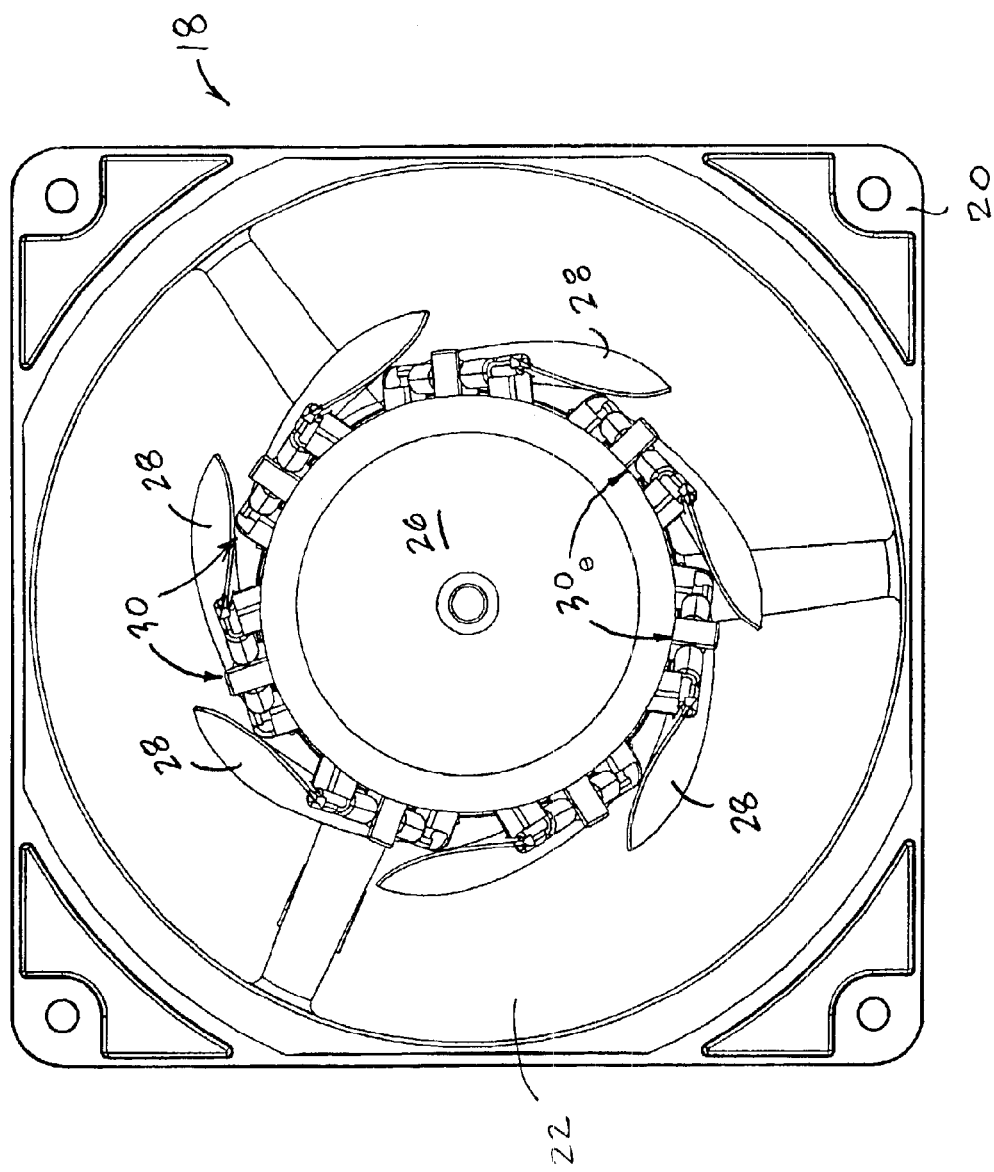
FIG. 3A is a front view of the fan with collapsible blades of FIG. 1 in the closed or collapsed position.
Figure 3B:
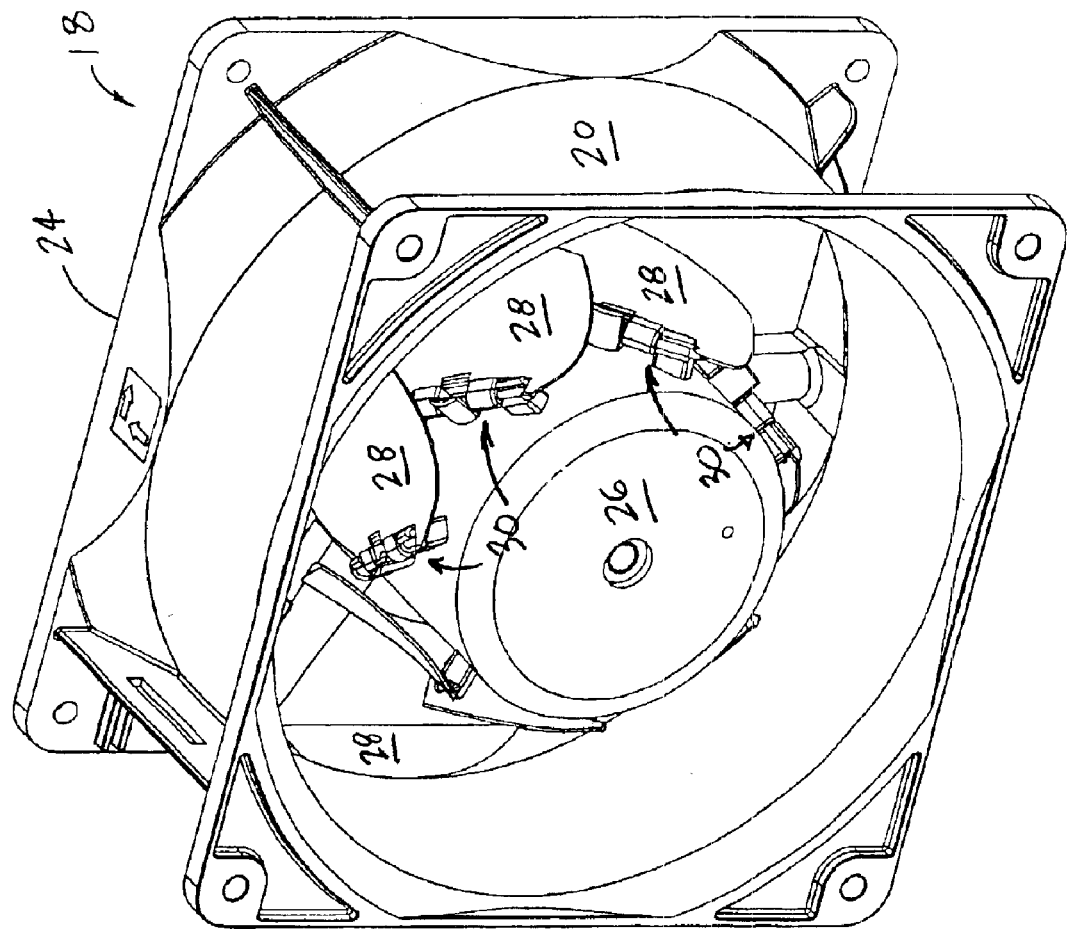
FIG. 3B is a perspective view of the fan with collapsible blades of FIG. 1 in the closed or collapsed position.

Referring now to FIGS. 2A, 2B, 3A, and 3B, numeral 18 generally refers to a fan with collapsible blades to be used in a redundant fan system. In FIGS. 2A and 2B, the collapsible blades 28 are shown in the open position. In FIGS. 3A and 3B, the collapsible blades 28 are shown in the collapsed position. The fan frame 20 has a first aperture 22 and a second aperture 24 located on the opposite side of the fan frame 20. The fan frame 20 contains a fan rotor 26 defining a rotor hub and a plurality of collapsible blades 28 pivotally connected to the rotor hub at pivot connectors 30. The fan rotor 26 includes mounted within the rotor hub an electric motor and wiring (not shown). In the currently preferred embodiments of the present invention, the motor is a brushless dc motor; however, as may be recognized by those of ordinary skill in the pertinent art based on the teachings herein, the motor may take any of numerous different configurations that are currently or later become known.

In the preferred embodiments, the fan frame 20 is the same general size and configuration as any of numerous different fans available in the prior art. A fan frame 20 that is the same size as existing computer fans is desired, but since the redundant fan system of the present invention is usable in other applications, other fan sizes and/or configurations can be employed as needed. In the illustrated embodiment, the first aperture 22 defines an inlet and the second aperture 24 defines an outlet. A person of ordinary skill in the pertinent art will recognize that the location of the inlet 22 and the outlet 24 depends on the airflow direction (i.e., the inlet 22 is not necessarily the free end of the rotor 26, as indicated in the Figures). In the preferred embodiment, the inlet 22 and the outlet 24 are unobstructed. If, however, the fan 18 is installed in a location where contact with moving blades is possible, a mesh or screen may be provided on either the inlet 22, the outlet 24, or both, to reduce the possibility of contact with the blades and to prevent intrusion of foreign objects into the fan.

The fan 18 contains a rotor 26 with a plurality of pivot connectors 30 secured to the exterior of the rotor 26. The exact number of pivot connectors 30 can vary depending on space, cost, or application that the redundant fan system is used for. Similarly, the orientation of the pivot connectors 30 with respect to the fan rotor 26 may vary provided the blades 28 collapse substantially in the direction of the airflow through the fan frame 20 when the fan 18 is not operating. In a currently preferred embodiment, the pivot connectors 30 are installed at an angle oblique to the axis of the rotor 26. Snap-fit or pin-type pivot connectors 30 are currently contemplated; however, as may be recognized by those of ordinary skill in the pertinent art based on the teachings herein, the pivot connectors may take any of numerous different configurations that are currently or later become know for performing the function of the connectors disclosed herein.

Figure 4B:
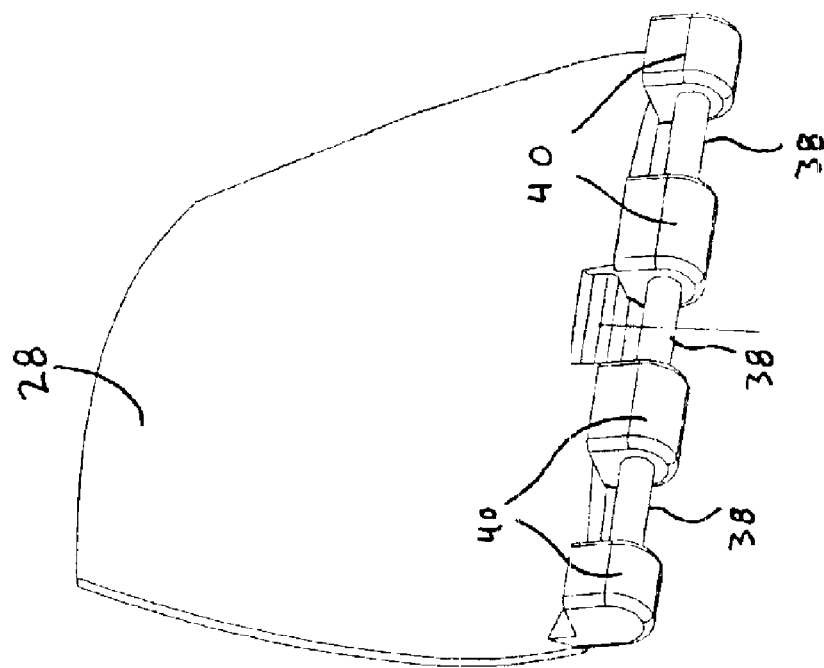
FIG. 4B is a perspective view of a collapsible fan blade of one of the fans of FIGS. 2 and 3 illustrating the pivot pins that are received within the pivot mounts of FIG. 4A for pivotally mounting the collapsible blades to the rotor.
Figure 4A:
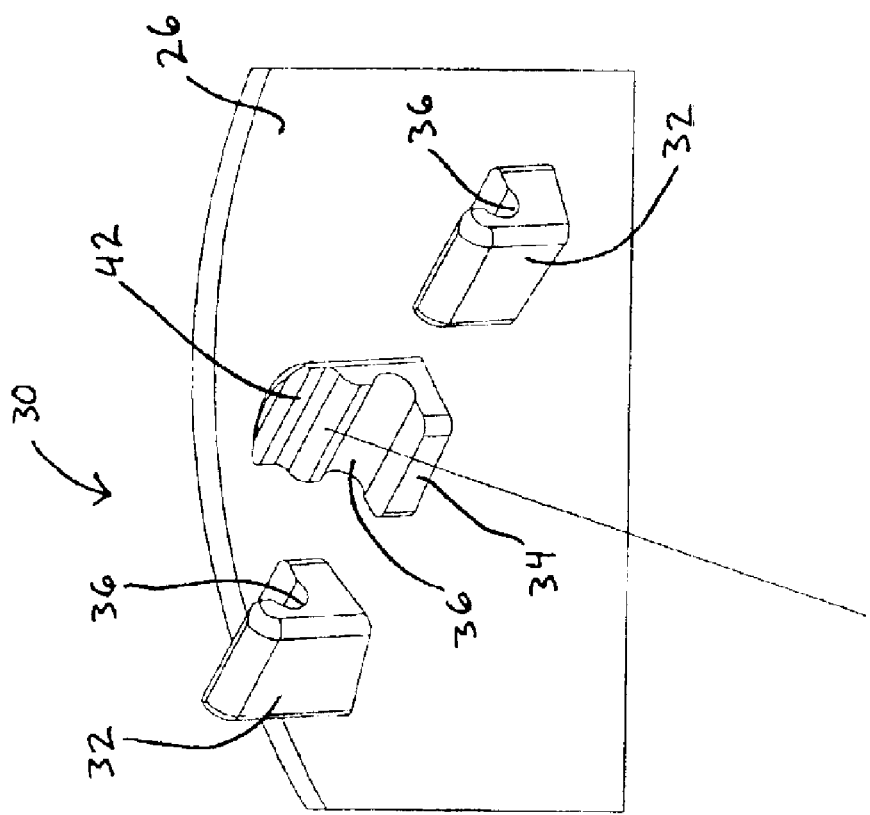
FIG. 4A is a partial, perspective view of one of the fans of FIGS. 2 and 3 illustrating the pivot mounts of a pivot connector formed on the fan rotor.
Figure 6B:
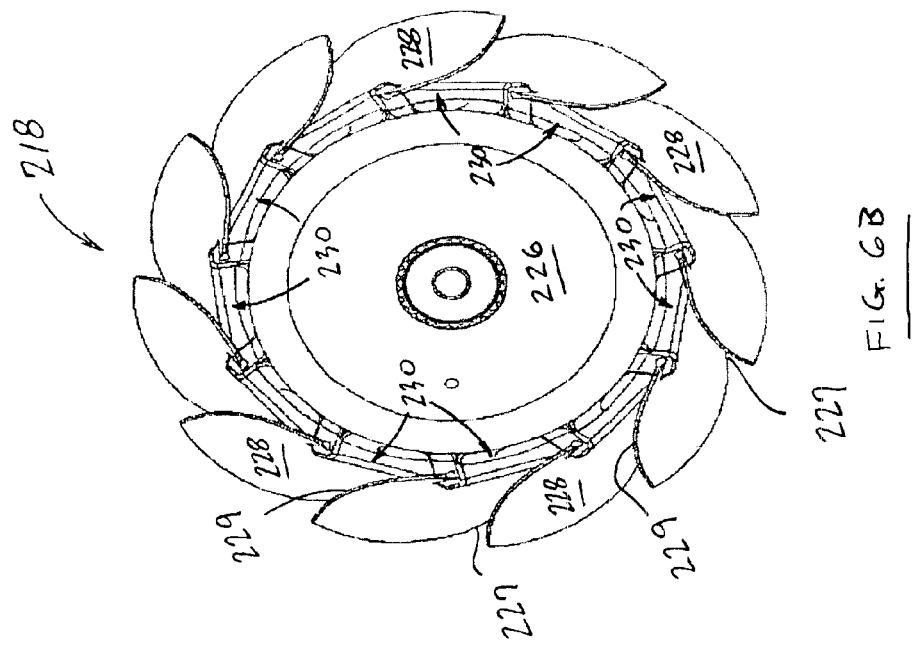
FIG. 6B is a rear elevational view of the fan of FIG. 6A illustrating the blades in a collapsed or closed condition.
Figure 6A:
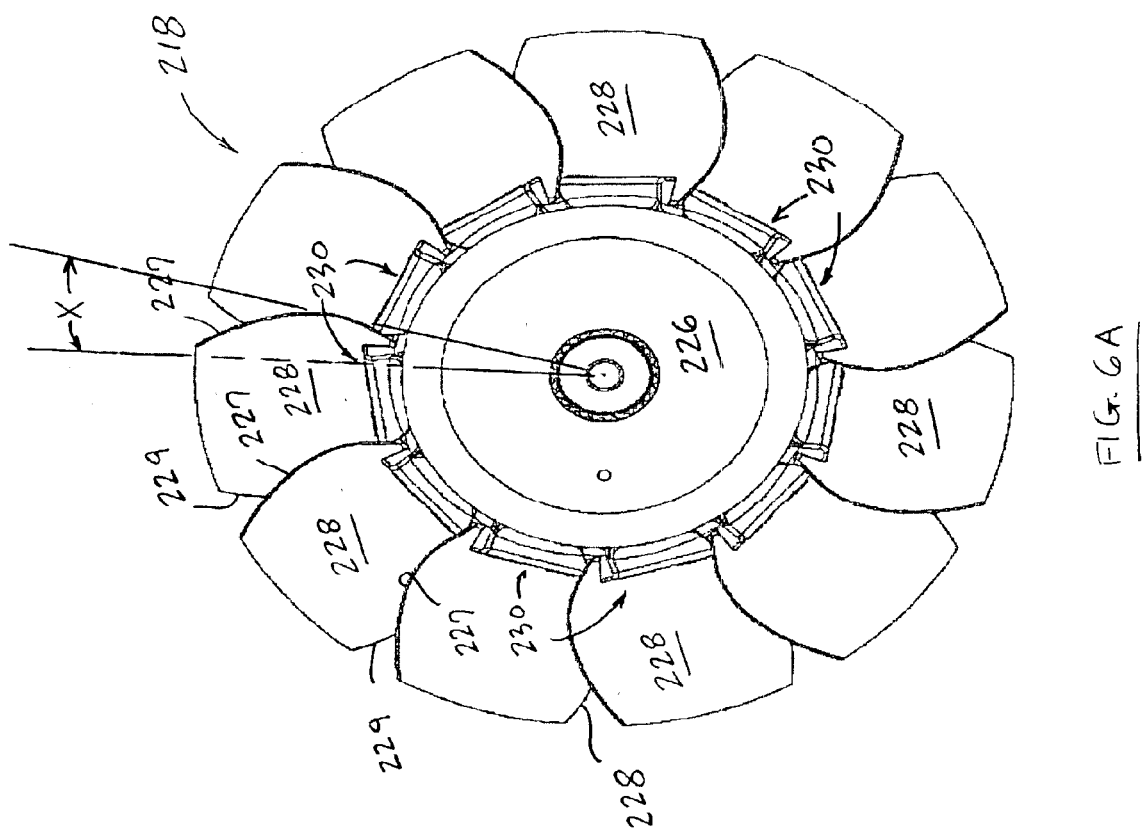
FIG. 6A is a front elevational view of another fan embodying the present invention including collapsible blades that angularly overlap one another (i.e., the leading edge of each blade angularly overlaps the trailing edge of the adjacent blade) and illustrating the blades in an open condition.

As shown in FIGS. 4A and 4B, a typical snap-fit pivot connector 30 includes a pair of first pin mounts 32 located on the peripheral surface of the rotor 26 and a second pin mount 34 located on the peripheral surface of the rotor and spaced between the first pin mounts 32. As shown in FIG. 4A, each of the first and second pin mounts 32 and 34, respectively, defines an axially-elongated groove or recess 36. As shown in FIG. 4B, each collapsible blade 28 includes on its base three pivot pins 38 with flange portions 40 formed at the ends of the pivot pins. The pins 38 are received within the grooves 36 of the respective pin mounts 32, 34 to thereby form a respective pivot connector 30. As can be seen, the grooves 36 and corresponding pins 38 are shaped and dimensioned to form a snap-fit such that the pins are retained within the grooves, but are allowed to pivot within the grooves to thereby pivotally mount the collapsible blades to the rotor. As shown typically in FIG. 4A, the grooves 36 of each pivot connector 30 are axially aligned with each other, and the axes of the grooves are oriented at an oblique angle with respect to the axis of the rotor to thereby mount the collapsible blades on the rotor at the oblique angle. As also shown typically in FIG. 4A, each second pin mount 34 defines a radially extending post 42 that engages the adjacent surface of the respective collapsible blade 28 when the fan is rotating to prevent further outward movement of the blade and thereby fix the position of the blade in the open or operational position.

In FIGS. 5A through 5E, another pivot connector employed in the fan system of the present invention is indicated generally by the reference numeral 130. The pivot connector 130 is substantially similar to the pivot connector 30 described above, and therefore like reference numerals preceded by the numeral "1" are used to indicate like elements. A primary difference of the pivot connector 130 in comparison to the pivot connector 30 is that the connector 130 includes a single pivot pin 138 that is slidably received through axially-elongated apertures 140 formed through the flange portions 140 of the respective collapsible blade 128. As shown typically in FIG. 5B, the base of each collapsible blade defines a stop surface 146 for engaging one end of the respective pivot pin 138. In order to assemble each pivot connector 130, the pivot pin 138 is slidably inserted through the apertures 144 in the flange portions 140 until the end of the pin engages the stop surface 146, as shown typically in FIG. 5E. Then, the assembled blade 128 and pivot pin 138 are moved into engagement with the respective mounts 132, 134 on the rotor 126 until the pivot pin 138 is snapped into the grooves 136 of the mounts to thereby retain the pin within the mounts. As shown typically in FIG. 5A, one of the first mounts 132 includes an end wall 148 for preventing axial movement of the pin and thus retaining the pin within the mounts.

The collapsible blades 28 may be constructed in any shape or size required for the particular application in which the redundant fan system is used. In the preferred embodiment shown, the collapsible blades 28 are generally square shaped with rounded outer edges. Other blade shapes can be used depending on the specific application, including, but not limited to, oval, teardrop, square, oblong, or any other shape now known in the art or developed in the future.

Figure 7A:
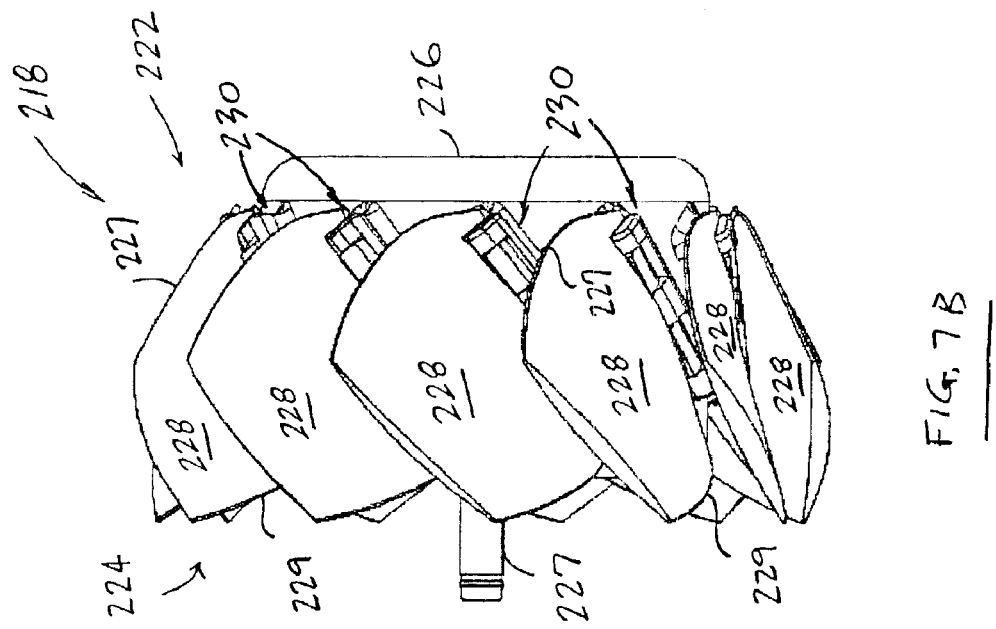
FIG. 7A is a side elevational view of the fan of FIG. 6A illustrating the blades in an open condition.
Figure 7B:
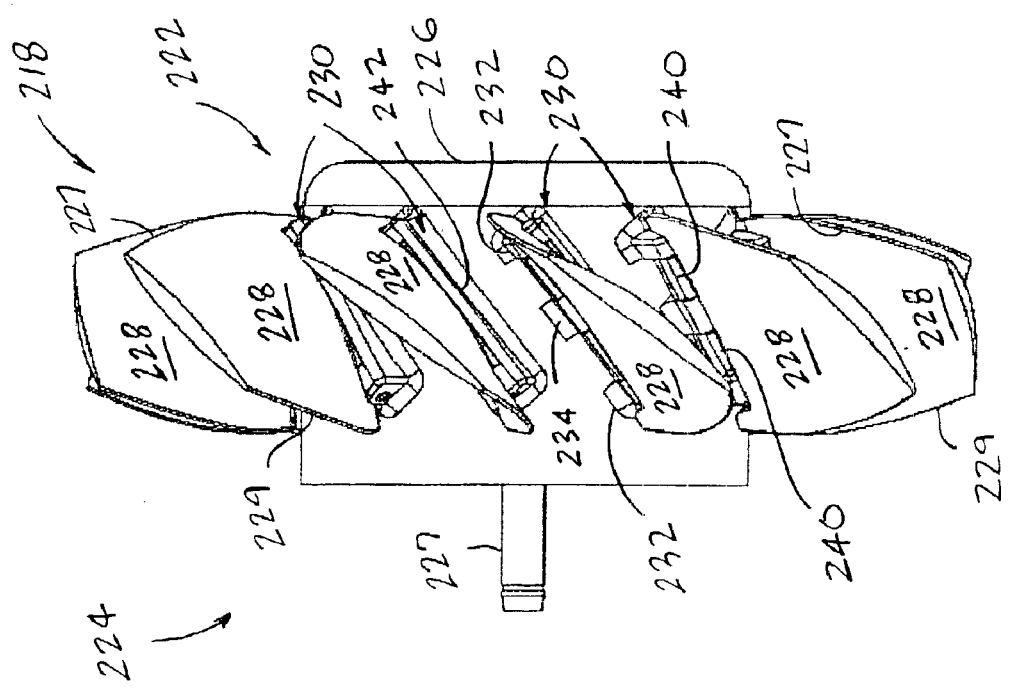
FIG. 7B is a side elevational view of the fan of FIG. 6A illustrating the blades in a collapsed or closed condition.

In FIGS. 6A through 7B, another tube axial fan with collapsible blades embodying the present invention is indicated generally by the reference number 218. The fan 218 is substantially similar to each fan 18 described above, and therefore like reference numerals preceded by the numeral "2", or preceded by the numeral "2" instead of the numeral "1", are used to indicate like elements. The primary difference of the fan 218 in comparison to the fans 18 described above is that the blades 228 angularly overlap one another. As shown typically in FIG. 6A, each blade 228 defines a leading edge 227 and a trailing edge 228. As can be seen, each leading edge 227 angularly overlaps the trailing edge 229 of the adjacent blade by an angular amount "x". Accordingly, a significant advantage of the fan 218 is that the number of blades 228 for a given fan size can be increased in comparison to the number of blades mounted on a fan of the same size wherein the blades and rotor hub are manufactured by conventional injection molding without collapsible blades. As may be recognized by those of ordinary skill in the pertinent art based on the teachings herein, the degree of angular overlap, shapes and dimensions of the overlapping blades 228 may be set as desired or otherwise required in order to enhance the performance of the fan and/or otherwise meet the objectives a particular application. As can be seen in FIGS. 7A and 7B, the fan 218 includes a shaft 227 mounted on the axis of the rotor 226 for rotatably supporting the fan on a fan frame (not shown). In addition, the pivot connectors 230 may be the same as the pivot connectors described above. Alternatively, as shown typically in FIG. 7A, the post 242 for engaging the respective blade in the open position may extend laterally adjacent to the base of the blade. However, as indicated above, the pivot connectors may take any of numerous different configurations that are currently or later become known for performing their function as disclosed herein.

While standard computer fans are constructed of plastic, the components of the fan and redundant fan system of the present invention could be constructed of plastic, aluminum, steel, or other materials, or any combination of such materials. Material selection may vary based on the application that the fan or redundant fan system is used in, and on any properties that the fan components must have (e.g., corrosion resistance, heat resistance, etc.). The fans and redundant fan system of the present disclosure may operate effectively regardless of material selected for the fan housing. It is currently desired, however, that the collapsible blades be of a material that is light enough to fold inward when in the non-operational state and when air from the operational fan is moving over the collapsible blades.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention as defined by the appended claims.

What is claimed is:

1. A collapsible fan for use in a redundant fan system comprising a first fan including a fan frame, a rotor rotatably mounted on the fan frame, a first aperture located on one side of the rotor, a second aperture located on an opposite side of the rotor relative to the first aperture, and a plurality of fan blades mounted on the rotor, the collapsible fan comprising:
   a fan frame, a rotor rotatably mounted on the fan frame, a first aperture located on one side of the rotor, a second aperture located on an opposite side of the rotor relative to the first aperture, and a plurality of collapsible fan blades pivotally mounted on the rotor, wherein the collapsible fan is mountable adjacent to one of the first and second apertures of the first fan, and the collapsible fan blades are collapsible onto the respective rotor in connection with an airflow generated by the first fan.

2. The collapsible fan set forth in claim 1, further comprising a sensor for sensing a failure of the collapsible fan.

3. The collapsible fan set forth in claim 2, further comprising:
   a controller coupled to the sensor for energizing the first fan in response to a failure of the collapsible fan to, in turn, collapse the plurality of collapsible blades.

4. The collapsible fan set forth in claim 2, wherein the sensor is selected from the group including a vane switch, a locked rotor signal, a pressure sensor, and a temperature gauge.

5. The collapsible fan set forth in claim 1, wherein the plurality of collapsible blades are opened and maintained in the open position in response to centrifugal force generated by rotation of the rotor.

6. The collapsible fan set forth in claim 1, further comprising a plurality of pivot connectors that pivotally connect a plurality of collapsible blades to the rotor.

7. The collapsible fan set forth in claim 6, wherein the rotor includes a plurality of pivot mounts angularly spaced relative to each other, and each pivot connector includes a pivot pin received within the respective pivot mount for pivotally connecting a respective blade to the rotor.

8. The collapsible fan set forth in claim 1, wherein the fan is a brushless dc fan.

9. The collapsible fan set forth in claim 1, wherein a plurality of the collapsible fan blades angularly overlap one another.

10. The collapsible fan of claim 1, in combination with a redundant fan system, comprising:
   a first fan including a fan frame, a rotor rotatably mounted on the fan frame, a first aperture located on one side of the rotor, a second aperture located on an opposite side of the rotor relative to the first aperture, and a plurality of fan blades mounted on the rotor; and wherein the collapsible fan forms a second fan mounted adjacent to one of the first and second apertures of the first fan, and the collapsible fan blades of the second fan are collapsible onto the respective rotor upon rotating the first fan rotor.

11. The redundant fan system set forth in claim 10, further comprising a frame for mounting the first fan and second fan.

12. The redundant fan system set forth in claim 10, further comprising:

an enclosure having at least one outer wall, the enclosure defining an interior and an opening in the at least one outer wall, and wherein the first fan is located within the enclosure adjacent to the opening.

13. The redundant fan system set forth in claim 12, wherein the enclosure is a computer housing.

14. The redundant fan system set forth in claim 10, wherein both the first fan blades and second fan blades are collapsible.

15. The collapsible fan set forth in claim 1, wherein the plurality of collapsible blades are maintained in an open position in response to centrifugal force generated by rotation of the collapsible fan rotor, and collapse due to an airflow of the first fan.

16. A collapsible fan for use in a redundant fan system, wherein the redundant fan system comprises the collapsible fan and a first fan including a fan frame, a rotor rotatably mounted on the fan frame, a first aperture located on one side of the rotor, a second aperture located on an opposite side of the rotor relative to the first aperture, and a plurality of fan blades mounted on the rotor, the collapsible fan comprising:

a fan including a fan frame, a rotor rotatably mounted on the fan frame, a first aperture located on one side of the rotor, a second aperture located on an opposite side of the rotor relative to the first aperture, and a plurality of fan blades mounted on the rotor; and means for collapsing the fan blades toward the rotor in connection with an airflow generated by the first fan.

17. The collapsible fan set forth in claim 16, wherein a plurality of the collapsible fan blades angularly overlap one another.

18. The collapsible fan set forth in claim 16, wherein the means for collapsing is defined by a plurality of pivot connectors, and each pivot connector pivotally connects a respective fan blade to the rotor.

19. The collapsible fan set forth in claim 18, wherein each pivot connector includes at least one mounting surface on one of the rotor and the blade, and at least one pivot pin on the other of the rotor and the blade that is retained on the mounting surface.

20. The collapsible fan set forth in claim 16, further comprising:

first means for energizing the first fan in response to a failure of the collapsible fan to, in turn, collapse the plurality of collapsible blades of the failed collapsible fan; and second means coupled to the first means for sensing a failure of the collapsible fan.

21. The collapsible fan set forth in claim 20, wherein the second means is selected from the group including a vane switch, a locked rotor signal, a pressure sensor, and a temperature gauge.

22. The collapsible fan of claim 16 in combination with a redundant fan system, comprising:

a first fan including a fan frame, a rotor rotatably mounted on the fan frame, a first aperture located on one side of the rotor, a second aperture located on an opposite side of the rotor relative to the first aperture, and a plurality of fan blades mounted on the rotor.

23. The redundant fan system set forth in claim 22, in combination with a computer defining a housing and a plurality of computer components mounted within the housing, and wherein the redundant fan system is mounted on the housing for cooling the components within the housing.

24. The redundant fan system set forth in claim 22, wherein the two fans are substantially axially aligned with each other.

25. A collapsible fan for use in a redundant fan system comprising a first fan including a fan frame, a rotor rotatably mounted on the fan frame, a first aperture located on one side of the rotor, a second aperture located on an opposite side of the rotor relative to the first aperture, and a plurality of fan blades mounted on the rotor, the collapsible fan comprising:

a fan frame, a rotor rotatably mounted on the fan frame, a first aperture located on one side of the rotor, a second aperture located on an opposite side of the rotor relative to the first aperture, and a plurality of collapsible fan blades pivotally mounted on the rotor at an angle oblique to an axis of the rotor, wherein the collapsible fan is mountable adjacent to one of the first and second apertures of the first fan, and the collapsible fan blades are collapsible onto the respective rotor upon rotating the first fan rotor.

26. A collapsible fan for use in a redundant fan system comprising a first fan including a fan frame, a rotor rotatably mounted on the fan frame, a first aperture located on one side of the rotor, a second aperture located on an opposite side of the rotor relative to the first aperture, and a plurality of fan blades mounted on the rotor, the collapsible fan comprising:

a fan frame, a rotor rotatably mounted on the fan frame, a first aperture located on one side of the rotor, a second aperture located on an opposite side of the rotor relative to the first aperture, a plurality of collapsible fan blades pivotally mounted on the rotor, a plurality of pivot connectors that pivotally connect a plurality of collapsible blades to the rotor, and a plurality of pivot mounts angularly spaced relative to each other about the rotor, wherein each pivot connector includes a pivot pin received within the respective pivot mount for pivotally connecting a respective blade to the rotor, each pivot mount includes a recess, and each pivot pin is frictionally engaged within the respective recess to secure the respective blade to the blade mount, and wherein the collapsible fan is mountable adjacent to one of the first and second apertures of the first fan, and the collapsible fan blades are collapsible onto the respective rotor upon rotating the first fan.

27. A method of providing redundant airflow comprising the steps of:

providing a first fan including a plurality of collapsible fan blades;

providing a second fan adjacent to the first fan; and activating the second fan upon a failure of the first fan and collapsing the blades of the first fan in connection with an airflow generated by the second fan.

28. The method set forth in claim 27, further comprising the step of sensing the failure of the first fan, and activating the second fan upon sensing the failure of the first fan.

29. The method set forth in claim 27, further comprising the step of mounting the first and second fans in approximate axial alignment with each other.

30. The method set forth in claim 27, further comprising the step of mounting at least one of the first and second fans within a computer housing.

31. A collapsible fan for use in a redundant fan system comprising a first fan including a fan frame, a rotor rotatably mounted on the fan frame, a first aperture located on one side of the rotor, a second aperture located on an opposite side of the rotor relative to the first aperture, and a plurality of fan blades mounted on the rotor, the collapsible fan comprising:

a fan including a fan frame, a rotor rotatably mounted on the fan frame, a first aperture located on one side of the rotor, a second aperture located on an opposite side of the rotor relative to the first aperture, and a plurality of fan blades connected to the rotor at an angle oblique to an axis of the rotor; and means for collapsing the fan blades toward the rotor upon rotating the rotor of the first fan.

32. The collapsible fan set forth in claim 31, wherein a plurality of the collapsible fan blades angularly overlap one another.

33. The collapsible fan set forth in claim 31, wherein the means for collapsing is defined by a plurality of pivot connectors, and each pivot connector pivotally connects a respective fan blade to the rotor at an angle oblique to the axis of the rotor.

34. The collapsible fan set forth in claim 33, wherein each pivot connector includes at least one mounting surface on one of the rotor and the blade, and at least one pivot pin on the other of the rotor and the blade that is retained on the mounting surface.

35. A collapsible fan as defined in claim 31, wherein said means collapses the fan blades in connection with an airflow generated by the first fan.

\* \* \* \* \*